(12) United States Patent
Kim et al.

(10) Patent No.: US 7,108,949 B2
(45) Date of Patent: Sep. 19, 2006

(54) DONOR SUBSTRATE FOR LASER INDUCED THERMAL IMAGING METHOD, METHOD OF FABRICATING THE DONOR SUBSTRATE, AND METHOD OF FABRICATING ORGANIC LIGHT EMITTING DISPLAY USING THE DONOR SUBSTRATE

(75) Inventors: Mu-Hyun Kim, Suwon-si (KR); Byung-Doo Chin, Seongnam-si (KR); Myung-Won Song, Suwon-si (KR); Seong-Taek Lee, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 11/017,678

(22) Filed: Dec. 22, 2004

(65) Prior Publication Data

US 2006/0046181 A1  Mar. 2, 2006

(30) Foreign Application Priority Data

Aug. 30, 2004 (KR) .................. 10-2004-0068756

(51) Int. Cl.
*G03F 7/34* (2006.01)
*G03F 7/11* (2006.01)

(52) U.S. Cl. .................. 430/200; 430/271.1; 430/319; 428/32.77; 428/32.8; 428/32.81

(58) Field of Classification Search ................ 430/200, 430/271.1, 319; 428/32.77, 32.8, 32.81
See application file for complete search history.

(56) References Cited

U.S. PATENT DOCUMENTS

| | | | |
|---|---|---|---|
| 5,998,085 A | 12/1999 | Isberg et al. | 430/200 |
| 6,114,085 A | 9/2000 | Padmanaban et al. | 430/270.1 |
| 6,194,119 B1 * | 2/2001 | Wolk et al. | 430/200 |
| 6,214,520 B1 | 4/2001 | Wolk et al. | 430/273.1 |
| 6,221,543 B1 | 4/2001 | Guehler et al. | |
| 6,458,504 B1 * | 10/2002 | Wachi et al. | 430/200 |
| 2003/0068525 A1 * | 4/2003 | Bellmann et al. | 428/690 |
| 2003/0157425 A1 | 8/2003 | Kawase | |

FOREIGN PATENT DOCUMENTS

| | | | |
|---|---|---|---|
| EP | 851714 | * | 7/1997 |
| EP | 1 329 955 A2 | | 7/2003 |
| KR | 2002-0016128 | | 3/2002 |

* cited by examiner

*Primary Examiner*—Richard L. Schilling
(74) *Attorney, Agent, or Firm*—H.C. Park & Associates, PLC

(57) ABSTRACT

A donor substrate for a laser induced thermal imaging method and an organic light emitting display (OLED) fabricated using the donor substrate are provided. There is also provided a method of fabricating an OLED capable of controlling static electricity when an organic layer is formed using an laser induced thermal imaging method, since the donor substrate having a conductive layer is electrically connected to an earthed stage.

12 Claims, 5 Drawing Sheets

DONOR SUBSTRATE FOR LASER INDUCED THERMAL IMAGING METHOD, METHOD OF FABRICATING THE DONOR SUBSTRATE, AND METHOD OF FABRICATING ORGANIC LIGHT EMITTING DISPLAY USING THE DONOR SUBSTRATE

CROSS-REFERENCE TO RELATED APPLICATION

This application claims the benefit of Korean Patent Application No. 2004-68756, filed Aug. 30, 2004, the disclosure of which is hereby incorporated herein by reference in its entirety.

BACKGROUND OF THE INVENTION

1. Field of the Invention

The present invention relates to a method of fabricating an organic light emitting display and, more particularly, to a donor substrate for a laser induced thermal imaging method capable of controlling static electricity and a method of fabricating an organic light emitting display using the same.

2. Description of the Related Art

Recently, since an organic light emitting display (OLED) has low voltage driving characteristics, high luminous efficiency, wide viewing angle and rapid response speed to display a high quality moving picture, the OLED is attracting public attention as a next generation flat panel display.

In addition, the OLED is constituted of an organic layer including an organic emission layer disposed between an anode and a cathode. Since the OLED is an emissive display capable of emitting light due to recombination of electrons and holes in the organic emission layer by applying voltage to the two electrodes, the OLED does not require a backlight unit, unlike a liquid crystal display (LCD). Therefore, it is possible to make the OLED in a lightweight and thin type, and using simple processes.

The OLED is classified into a small molecular OLED and a polymer OLED according to the material of the organic layer, in particular, the organic emission layer.

The small molecular OLED includes multiple organic layers having different functions from each other, which are interposed between an anode and a cathode, wherein the multiple organic layers include a hole injection layer, a hole transport layer, an emission layer, a hole blocking layer and an electron injection layer. These layers may be adjusted by doping to prevent the accumulation of electric charges or replacing with a material having a suitable energy level. The small molecular OLED is generally made by a vacuum deposition method and thus it is difficult to realize a large-sized display.

On the other hand, the polymer OLED has a single layer structure having an organic emission layer interposed between an anode and a cathode or a double layer structure including a hole transport layer in addition to the organic emission layer, and thus may be fabricated into a thin device. In addition, since the organic layer is formed by a wet coating method, the polymer OLED may be fabricated under atmospheric pressure, thereby reducing the manufacturing cost and readily realizing the large-sized OLED.

In the case of a monochrome device, the polymer OLED may be simply fabricated by a spin coating method, but has disadvantages of lower efficiency and shorter lifetime compared to the small molecular OLED. In the case of a full color device, emission layers for showing three primary colors of red, green and blue may be patterned in such an OLED to realize the full color. In this case, the organic layer of the low small OLED may be patterned by a shadow mask deposition method, and the organic layer of the polymer OLED may be patterned by an ink jet printing method or a laser induced thermal imaging (hereinafter will be referred to as "LITI") method. The LITI method may utilize spin coating characteristics as they are, thereby resulting in excellent internal uniformity of pixels in the large-sized OLED. In addition, since the LITI method adopts a dry process instead of a wet process, the LITI method may prevent lifetime reduction by solvent as well as realize a fine pattern in the organic layer.

Application of the LITI method basically needs a light source, an OLED substrate (hereinafter will be referred to as "substrate") and a donor substrate, wherein the donor substrate includes a base layer, a light-to-heat conversion layer and a transfer layer.

According to the LITI method, light emitted from the light source is absorbed by the light-to-heat conversion layer to convert the light into heat energy, so that an organic material formed on the transfer layer is transferred onto the substrate by the converted heat energy.

Methods of forming a pattern of an OLED using the LITI method are disclosed in Korean Patent Registration No. 10-0342653, and U.S. Pat. Nos. 5,998,085, 6,214,520 and 6,114,085.

FIGS. 1A to 1C are cross-sectional views illustrating processes of patterning an organic layer using an LITI method.

Referring to FIG. 1A, a substrate 10 is prepared, and a donor substrate 20 including a base layer 21, a light-to-heat conversion layer 22, and a transfer layer 23 is laminated on the substrate 10.

Next, as shown in FIG. 1B, a laser X is irradiated on a first region (a) in the base layer 21 of the donor substrate 20. The laser passed from the base layer 21 is converted to heat in the light-to-heat conversion layer 22, and the heat makes an adhesion between the first region (a) and the light-to-heat conversion layer 22 weak.

Continuously, as shown in FIG. 1C, the transfer layer, at which the adhesion is weakened, i.e., the transfer layer corresponding to the first region (a) is transferred onto the substrate 10 to form an organic layer 23a on the substrate 10, and a transfer layer (b), i.e., the transfer layer corresponding to a second region (b) where the laser is not irradiated, is separated together with the donor substrate, thereby forming a patterned organic layer 23a.

However, in forming the patterned organic layer using the LITI method, static electricity may be generated due to external environmental factors such as friction and so on during attachment and detachment processes of the donor substrate and the substrate. Since discharge voltage of this static electricity has a range of about several thousands to several ten thousands, the static electricity may cause defects such as a short-circuit at adhesion parts, or melting of metal or separation of wiring due to a temperature increase in the device, and therefore device characteristics may be deteriorated due to influence affecting to an inner circuit of the device.

SUMMARY OF THE INVENTION

The present invention, therefore, solves aforementioned problems associated with conventional devices by providing a method of fabricating an OLED capable of controlling generation of static electricity when an organic layer is formed using an LITI method.

In an exemplary embodiment of the present invention, a donor substrate for a laser induced thermal imaging method includes: a base layer; a light-to-heat conversion layer formed on an entire surface of the base layer; an anti-static layer formed on the light-to-heat conversion layer over an entire surface of the base layer; and a transfer layer formed on the anti-static layer and patterned to expose a predetermined portion of the anti-static layer, wherein the anti-static layer is made of a conductive material.

In another exemplary embodiment according to the present invention, a method of fabricating a donor substrate for a laser induced thermal imaging method includes: providing a base layer; forming a light-to-heat conversion layer on an entire surface of the base layer; forming an anti-static layer on the light-to-heat conversion layer over an entire surface of the base layer; and forming a transfer layer on the anti-static layer and patterning the transfer layer to expose a predetermined portion of the anti-static layer, wherein the anti-static layer is made of a conductive material.

In still another exemplary embodiment according to the present invention, a method of fabricating an OLED includes: forming a first electrode on a substrate through pattering; sucking and fixing the substrate to an earthed stage; laminating a donor substrate according to claim 1 having a conductive layer on the substrate; selectively irradiating a laser on the donor substrate to transfer an organic layer including at least an emission layer; delaminating the donor substrate from the substrate after transferring the organic layer on the substrate; and forming a second electrode on the organic layer.

In addition, the present invention provides an OLED fabricated using the method.

BRIEF DESCRIPTION OF THE DRAWINGS

The above and other features of the present invention will be described in reference to certain exemplary embodiments thereof with reference to the attached drawings in which.

DETAILED DESCRIPTION OF THE INVENTION

The present invention will now be described more fully hereinafter with reference to the accompanying drawings.

Figure 1A:
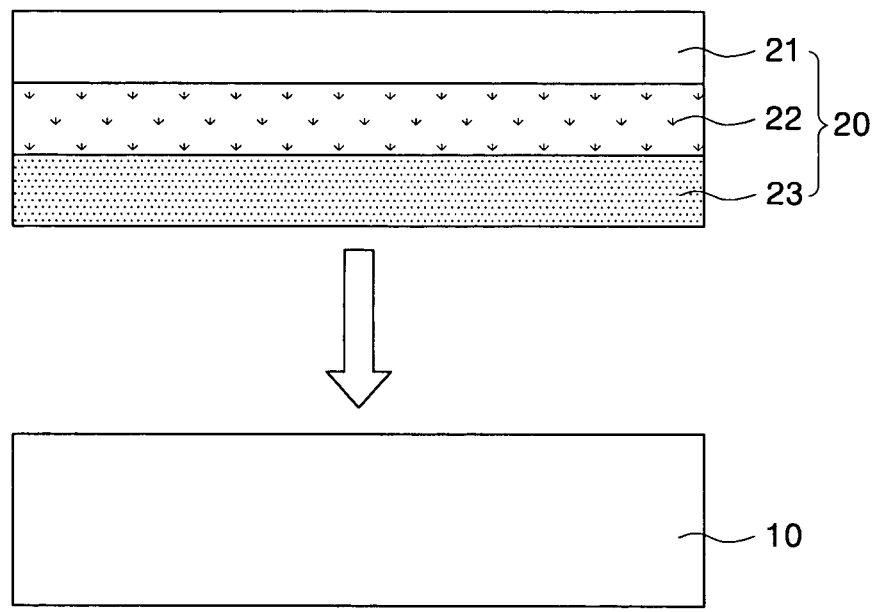
FIGS. 1A to 1C are cross-sectional views illustrating an organic layer patterning process using an LITI method.
Figure 1B:
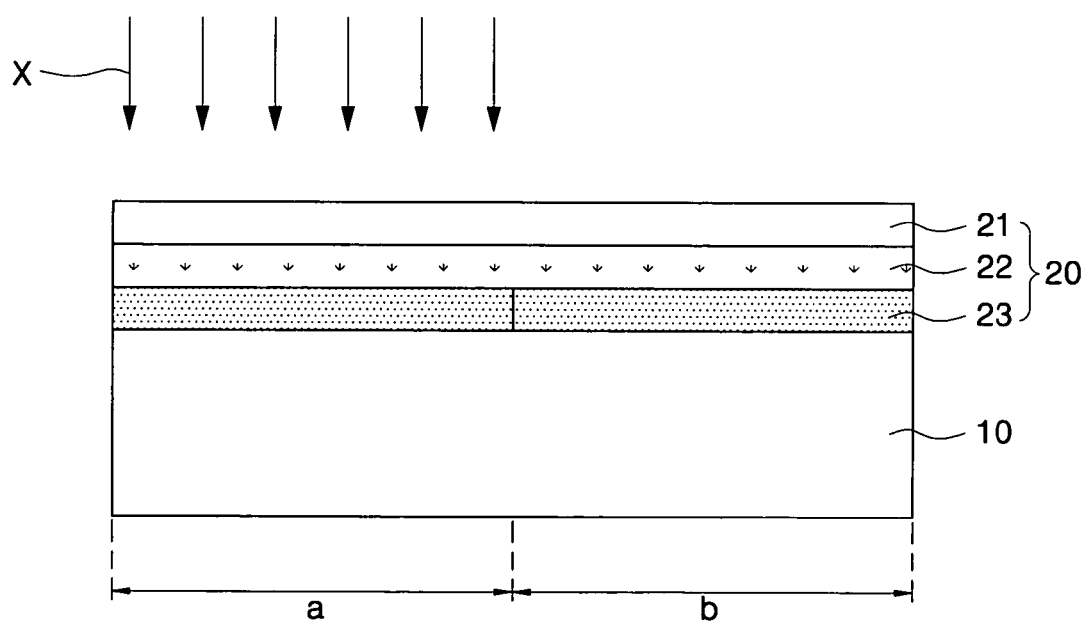
Figure 1C:
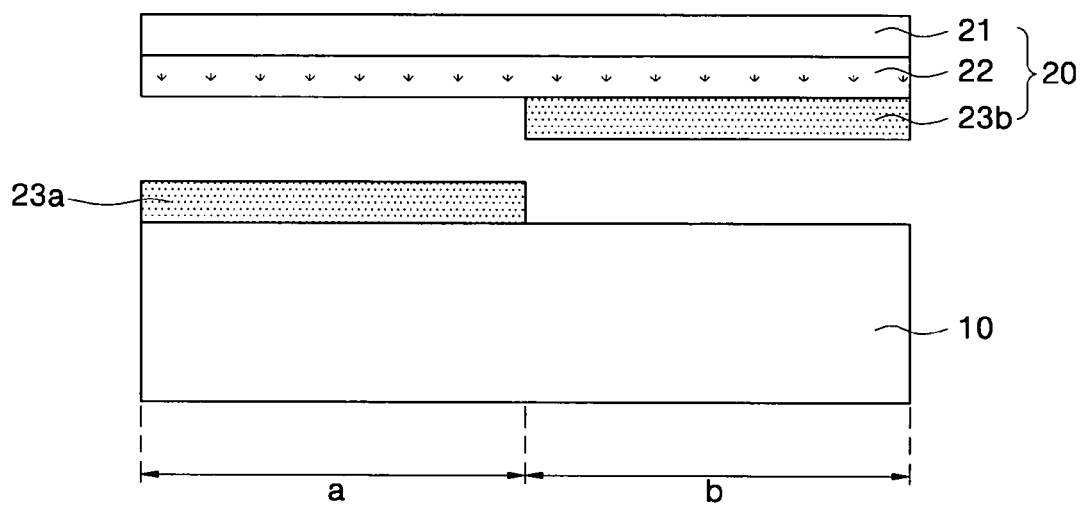
Figure 2:
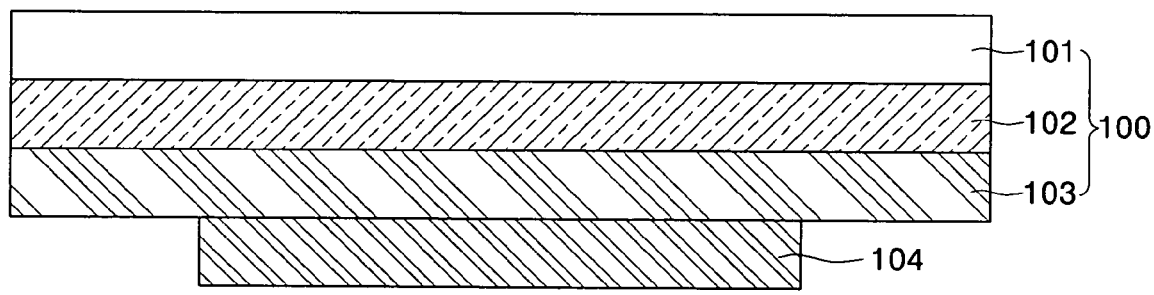
FIG. 2 is a cross-sectional view of a donor substrate in accordance with an exemplary embodiment of the present invention.

FIG. 2 is a cross-sectional view of a donor substrate in accordance with an exemplary embodiment of the present invention.

Referring to FIG. 2, a base layer 101 is provided, and a light-to-heat conversion layer 102, an anti-static layer 103 and a transfer layer 104 are sequentially deposited on the base layer 101.

The base layer 101 should have transparency to transmit light to the light-to-heat conversion layer 102, and may be made of a polymer material having appropriate optical characteristics and sufficient structural integrity. For example, the base layer 101 may be made of at least one polymer material selected from a group consisting of polyester, polyacryl, polyepoxy, polyethylene and polystyrene. More preferably, the base layer 101 may be polyethylene terephthalate.

The light-to-heat conversion layer 102 is a layer of absorbing light in infrared to visible light region and partially converting the light to heat, should have appropriate optical density, and preferably includes a light-absorbing material for absorbing light. In this process, the light-to-heat conversion layer 102 may be made of a metal layer formed of Ag, Al and their oxides and their sulfides, or an organic layer formed of a polymer material including carbon black, graphite or infrared dye. In this process, the metal layer may be formed by a vacuum deposition method, an electron beam deposition method or a sputtering method, and the organic layer may be formed by one of conventional film coating methods such as roll coating, gravure, extrusion, spin coating and knife coating methods.

The anti-static layer 103 is provided to control static electricity, which may be generated when the donor substrate is attached to the substrate or the donor substrate is detached from the substrate after laser irradiating. The anti-static layer 103 of the donor substrate 100 may be electrically connected to the earthed stage to suppress generation of the static electricity. The anti-static layer 103 may be formed of one material selected from an organic material, an inorganic material, and an organic-inorganic composite material. For example, the organic material may be one conductive polymer selected from a group consisting of polyaniline, polypyrole, polythiophene and poly(3,4-ethylenedioxythiophene). The conductive polymer has an advantage capable of evenly forming a layer using a wet coating method. In addition, the inorganic material may be one material selected from a group consisting of ATO (antimony tin oxide), ITO (indium tin oxide), IZO (indium zinc oxide), $Nb_2O_3$, ZnO and TiN. The inorganic material has a good conductivity to effectively control the static electricity, and excellent durability. Further, the organic-inorganic composite material may be one material selected from a group consisting of ATO sol, ITO sol, Ag—Pd and Ag—Ru. The organic-inorganic composite material has advantages capable of readily forming a thin layer and having a good conductivity since it is a sol state.

The transfer layer 104 may be made of one layer or a stack layer selected from a group consisting of an organic emission layer, a hole injection organic layer, a hole transport organic layer, a hole blocking organic layer, an electron injection organic layer and an electron transport organic layer.

The transfer layer 104 may be formed by one method selected from extrusion, spin coating, knife coating, vacuum deposition, CVD methods and so on. Then, a predetermined portion of the transfer layer is patterned to form a transfer layer pattern for exposing a portion of the conductive layer. As a result, when the organic layer is formed by an LITI process, the exposed anti-static layer of the donor substrate is electrically connected to the earthed stage to control the static electricity, which may be generated during the LITI process.

In addition, an intermediate layer, a predetermined portion of which is patterned, for improving transfer characteristics may be further included between the anti-static layer 103 and the transfer layer 104. In this process, the interlayer may be made of at least one layer selected from a gas generation layer, a buffer layer and a metal reflection layer.

When absorbing light or heat, the gas generation layer causes a decomposition reaction to discharge nitrogen gas or hydrogen gas, thereby providing transfer energy, and the gas generation layer may be made of pentaerythritetetra-nitrate (PETN) or trinitrotoluene(TNT).

The buffer layer functions to prevent the transfer layer from being contaminated or damaged due to a light-heat absorbing material during the following processes, and control an adhesion to the transfer layer to improve transfer pattern characteristics. In this process, the buffer layer may be made of metal oxide, non-metal inorganic compound, or inert polymer.

The metal reflection layer functions to reflect the laser irradiated onto the base layer of the donor substrate to transmit more much energy to the light-heat conversion layer, and prevent gas generated from the gas generation layer from penetrating into the transfer layer when the gas generation layer is disposed.

Hereinafter, a method of fabricating an OLED through an LITI method using a donor substrate in accordance with the present invention will be described in conjunction with FIGS. 3A to 3C.

Figure 3A:
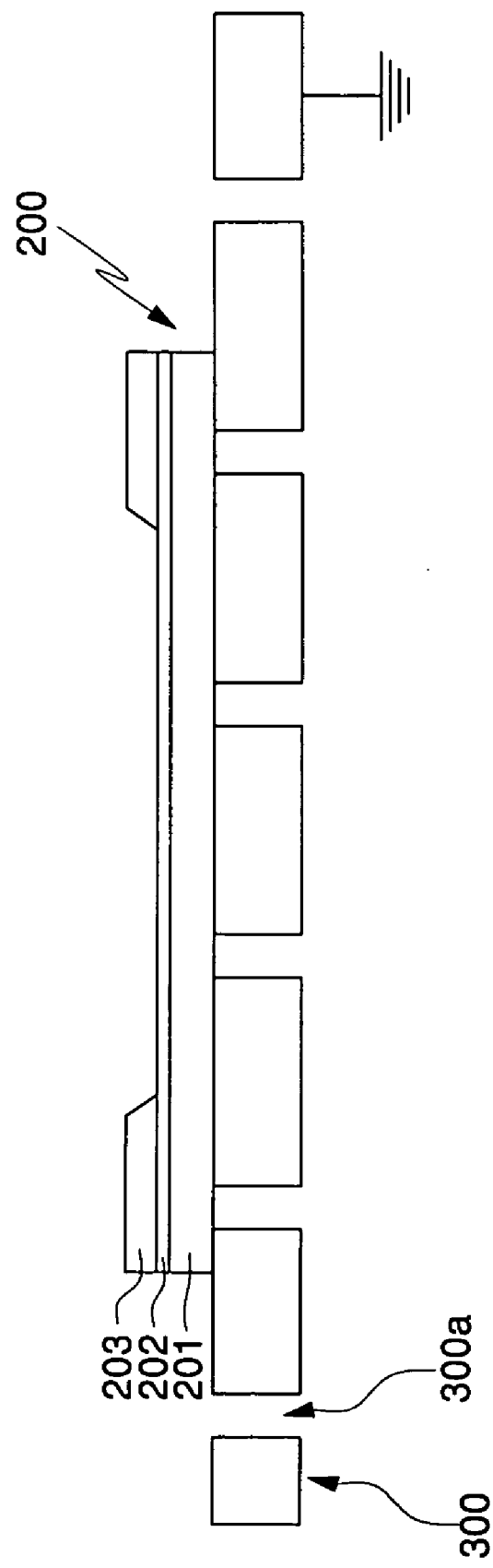
FIGS. 3A to 3C are cross-sectional views illustrating a method of fabricating an OLED through an LITI method using a donor substrate in accordance with the present invention.

Referring to FIG. 3A, a substrate 200 is supplied to an earthed substrate sucking stage 300.

In this process, the substrate 200 includes a first electrode 202 formed on a substrate 201 using a conventional method, and a pixel defining layer 203 for defining a pixel on the first electrode 202. In addition, the substrate 200 may include a thin film transistor (TFT) and a plurality of insulating layers. When the first electrode is an anode, the first electrode may be a transparent electrode made of ITO or IZO having a high work function, or a reflection electrode made of one selected from a group consisting of Pt, Au, Ir, Cr, Mg, Ag, Ni, Al and an alloy thereof.

On the other hand, when the first electrode is a cathode, the first electrode may be a thin transparent electrode or a thick reflection electrode made of one selected from Mg, Ca, Al, Ag, Ba and an alloy thereof having a low work function.

The substrate sucking stage 300, which is earthed, is means for sucking, fixing and moving the substrate 200 using a sucking part 300a.

Meanwhile, a donor substrate including a base layer 101, a light-to-heat conversion layer 102, an anti static layer 103 and a transfer layer 104 is fabricated in accordance with an embodiment of the present invention. In this process, preferably, the anti-static layer is partially exposed.

Figure 3B:
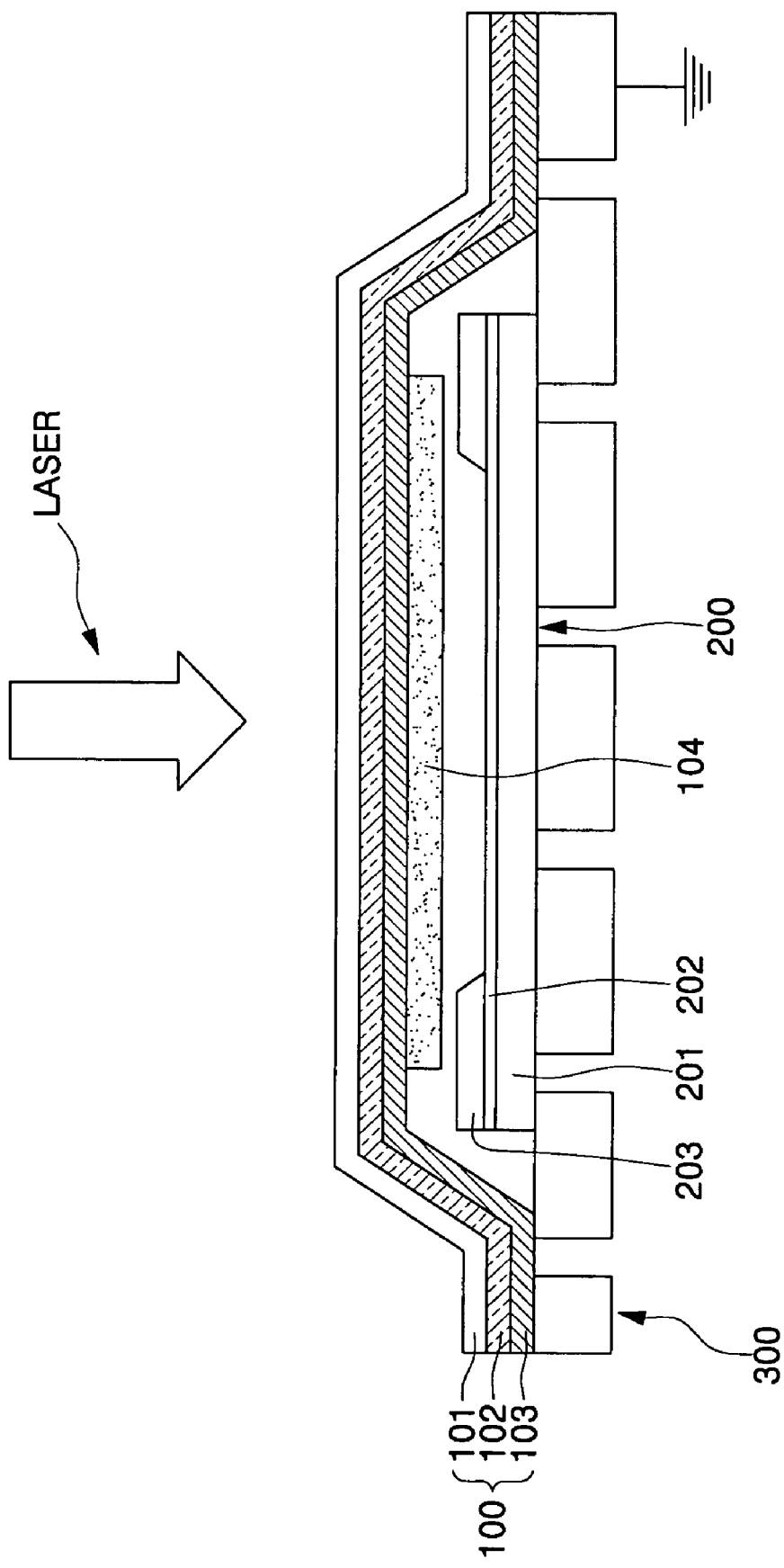

Next, as shown in FIG. 3B, the donor substrate 100 and the substrate 200 fixed on the substrate sucking stage 300 are disposed spaced apart from each other and the donor substrates 100 are laminated on the substrate 200. Then, a laser is irradiated on a predetermined region of the donor substrate to transfer the transfer layer on a pixel region of the first electrode. In this process, the exposed anti-static layer of the donor substrate may be electrically connected to the earthed stage to control the static electricity, which may be generated during the processes.

In this case, the transfer layer includes at least an organic emission layer, and may further include at least one layer selected from a group consisting of a hole injection layer, a hole transport layer, a hole blocking layer, an electron transport layer and an electron injection layer.

The organic emission layer may be made of: red light emitting materials, e.g., a low molecular material such as Alq3(host)/DCJTB(fluorescent dopant), Alq3(host)/DCM (fluorescent dopant), CBP(host)/PtOEP(phosphor organic metal complexes) and so on, and a polymer material such as a PFO-based polymer, a PPV-based polymer and so on; green light emitting materials, e.g., a low molecular material such as Alq3, Alq3(host)/C545t(dopant), CBP(host)/IrPPy (phosphor organic metal complexes) and so on, and a polymer material such as a PFO-based polymer, a PPV-based polymer and so on; and blue light emitting materials, e.g., a low molecular material such as DPVBi, spiro-DPVBi, spiro-6P, distyrylbenzene (DSB), distyrylarylene (DSA) and so on, and a polymer material such as a PFO-based polymer, a PPV-based polymer and so on.

When the first electrode is an anode, the hole injection layer is formed on the first electrode 202. Since the hole injection layer is formed of a material having a high interfacial adhesion to the first electrode 202 and low ionization energy, hole injection can be readily performed and device lifetime can be increased. The hole injection layer may be made of an aryl amine-based compound, a porphyrin-based metal complex, starburst amines, and so on. More specifically, the hole injection layer may be made of 4,4',4"-tris (3-methylphenylphenylamino)triphenylamino(m-MT-DATA), 1,3,5-tris[4-(3-methylphenylphenylamino)phenyl]benzene(m-MTDATB), phtarocyanine copper (CuPc), and so on.

The hole transport layer functions to readily transport holes to an emission layer and to suppress moving of electrons generated from the second electrode to an emission region, thereby increasing luminous efficiency. The hole transport layer may be made of arylene thiamine derivatives, starburst compound, biphenyl thiamine derivatives having spiro radical, ladder compound and so on. More specifically, the hole transport layer may be made of N,N-diphenyl-N, N'-bis(4-methylphenyl)-1,1'-biphenyl-4,4'-thiamine (TPD) or 4,4'-bis[N-(1-Naphthyl)-N-phenylamino]biphenyl (NPB).

The hole blocking layer functions to prevent the luminous efficiency from lowering, since it has a hole mobility larger than that in the organic emission layer and excitons formed in the emission layer are widely distributed. The hole blocking layer may be made of one material selected from a group consisting of 2-biphenyl-4-il-5-(4-t-buthylphenyl)-1,3,4-oxythiazol (PBD) and spiro-PBD, and 3-(4'-tert-buthylphenyl)-4-phenyl-5-(4'-biphenyl)-1,2,4-triazol (TAZ).

The electron transport layer may be deposited on the organic emission layer, made of a metal compound capable of readily receiving electrons, and may be made of 8-hydroquinoline aluminum (Alq3) having excellent characteristics capable of safely transporting the electrons supplied from the second electrode.

The organic layers except for the organic emission layer may be formed by a spin coating method or a deposition method, or may be formed together with the LITI process by additionally depositing one of the organic emission layer and the organic layers, when the transfer layer of the donor substrate is formed.

Figure 3C:
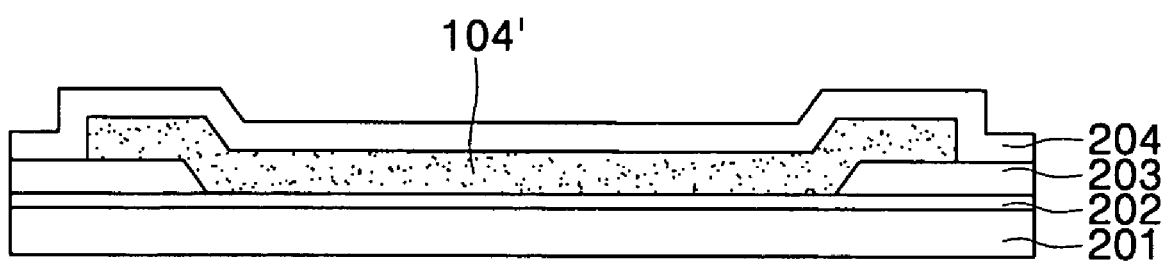

As shown in FIG. 3C, the donor substrate is delaminated to from an organic layer pattern after transferring the transfer layer on the first electrode. Next, after forming the second electrode on the organic layer pattern, although not shown, the OLED is completed by encapsulating with a metal can.

In this case, when the second electrode 204 is a cathode, the second electrode is formed on the organic layer 104', and may be made of a thin transparent electrode or a thick reflection electrode formed of one conductive metal selected from a group consisting of Mg, Ca, Al, Ag and an alloy thereof having a low work function.

In addition, when the second electrode is an anode, the second electrode may be formed of a transparent electrode made of ITO or IZO, or a reflection electrode made of Pt, Au, Ir, Cr, Mg, Ag, Ni, Al and an alloy thereof i.e., a metal having a high work function.

As can be seen from the foregoing, the present invention is capable of effectively control the static electricity, which may be generated during manufacture of the OLED using the LITI method, to prevent device characteristics from degrading, thereby implementing high quality display.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A donor substrate for a laser induced thermal imaging method, comprising:
   a base layer;
   a light-to-heat conversion layer formed on an entire surface of the base layer;
   an anti-static layer formed on the light-to-heat conversion layer over an entire surface of the base layer; and
   a transfer layer formed on the anti-static layer and patterned to expose a predetermined portion of the anti-static layer,
   wherein the anti-static layer is made of a conductive material and is grounded.

2. The donor substrate according to claim 1, wherein the conductive material is made of one material selected from an organic material, an inorganic material, and an organic-inorganic composite material.

3. The donor substrate according to claim 2, wherein the organic material is one material selected from a group consisting of polyaniline, polypyrole, polythiophene and poly(3,4-ethylenedioxythiophene).

4. The donor substrate according to claim 2, wherein the inorganic material is one material selected from a group consisting of ATO (antimony tin oxide), ITO (indium tin oxide), IZO (indium zinc oxide), $Nb_2O_3$, ZnO and TiN.

5. The donor substrate according to claim 2, wherein the organic-inorganic composite material is one material selected from a group consisting of ATO sol, ITO sol, Ag—Pd and Ag—Ru.

6. The donor substrate according to claim 1, further comprising an interlayer formed between the anti-static layer and the transfer layer to expose a predetermined portion of the anti-static layer.

7. The donor substrate according to claim 6, wherein the interlayer is made of at least one layer selected from a gas generation layer, a buffer layer and a metal reflection layer.

8. The donor substrate according to claim 1, wherein the transfer layer is made of a single layer or a stacked layer selected from a group consisting of an organic emission layer, a hole-injection organic layer, a hole-transport organic layer, a hole-blocking organic layer, an electron-injection organic layer and an electron-transport organic layer.

9. A method of fabricating a donor substrate for a laser induced thermal imaging method, comprising:
   providing a base layer;
   forming a light-to-heat conversion layer on an entire surface of the base layer;
   forming an anti-static layer on the light-to-heat conversion layer over an entire surface of the base layer; and
   forming a transfer layer on the anti-static layer and patterning the transfer layer to expose a predetermined portion of the anti-static layer,
   wherein the anti-static layer is made of a conductive material and is grounded.

10. A method of fabricating an organic light emitting display, comprising:
    forming a first electrode on a substrate through patterning;
    sucking and fixing the substrate to a grounded stage;
    laminating a donor substrate according to claim 1 having a exposed anti-static layer on the substrate;
    selectively irradiating a laser on the donor substrate to transfer an organic layer including at least an emission layer;
    delaminating the donor substrate from the substrate after transferring the organic layer on the substrate; and
    forming a second electrode on the organic layer.

11. The method according to claim 10, wherein the exposed anti-static layer of the donor substrate is electrically connected to the grounded stage.

12. The method according to claim 10, wherein the organic layer further comprises at least one selected from a group consisting of a hole-injection organic layer, a hole-transport organic layer, a hole-blocking organic layer, an electron-injection organic layer, and an electron-transport organic layer.

* * * * *